(12) United States Patent
Perroni et al.

(10) Patent No.: US 8,619,491 B2
(45) Date of Patent: Dec. 31, 2013

(54) ADDRESS DECODING DEVICE

(75) Inventors: Maurizio Francesco Perroni, Furnari (IT); Giuseppe Castagna, Palermo (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 63 days.

(21) Appl. No.: 13/406,186

(22) Filed: Feb. 27, 2012

(65) Prior Publication Data

US 2012/0221827 A1  Aug. 30, 2012

(30) Foreign Application Priority Data

Feb. 28, 2011 (IT) .............................. MI2011A0302

(51) Int. Cl.
*G11C 8/00* (2006.01)

(52) U.S. Cl.
USPC ............. 365/230.06; 365/189.08; 365/230.08

(58) Field of Classification Search
USPC ............. 365/230.06, 230.08, 189.08, 226, 365/189.05
See application file for complete search history.

(56) References Cited

U.S. PATENT DOCUMENTS

| 4,885,481 | A | * | 12/1989 | Hobbs et al. | ..................... 326/38 |
| 5,414,659 | A | | 5/1995 | Ito | .................. 365/200 |
| 5,537,349 | A | | 7/1996 | Devin | ....................... 365/185.33 |
| 5,909,394 | A | | 6/1999 | Chou | ....................... 365/185.21 |
| 7,969,804 | B1 | * | 6/2011 | Hirose et al. | .................. 365/206 |
| 8,125,835 | B2 | * | 2/2012 | Hirose et al. | ............. 365/185.29 |
| 2012/0188826 | A1 | * | 7/2012 | Hirose et al. | ............. 365/185.29 |

* cited by examiner

*Primary Examiner* — Gene Auduong
(74) *Attorney, Agent, or Firm* — Allen, Dyer, Doppelt, Milbrath & Gilchrist, P.A.

(57) ABSTRACT

An address decoding device may include a supply terminal for a supply voltage, a conductive path configured to provide an electric signal, associated with an address of at least one memory cell, and an address terminal connected to the conductive path and structured to receive the electric signal. An address decoder may be connected to the address terminal to receive the electric signal. The decoder may have a decoding operative voltage associated therewith. A switch circuit may be structured to electrically connect the address terminal to the supply terminal when the address terminal takes a threshold voltage imposed by the electric signal, and may bring the address terminal to the decoding operative voltage.

19 Claims, 5 Drawing Sheets

ADDRESS DECODING DEVICE

FIELD OF THE INVENTION

The present disclosure relates to the field of non-volatile memory, and, in particular, it relates to decoding procedures, and, even more particularly, to column decoding performed in a memory reading step.

BACKGROUND OF THE INVENTION

As it may be known, for non-volatile memory (which may include a floating-gate MOS transistor) reading a cell implies steps of address decoding the memory cell to be read, steps of routing the voltages for biasing the row and column lines which identify the cell within the array, and a step of sensing the cell content, with buffering the read data, which may be made available on a memory output pin.

To read a word within the memory, an address is decoded which may identify, univocally, a well-defined location within the cell array. The time needed to decode the address remarkably affects the access time of the memory, and therefore it may be the subject of continuous attempts of optimization.

Upon the increase of the dimensions of single partitions of memory cells forming the memory matrix, the length of the conductive paths which carry the address signals becomes higher, and it may become the element restricting the access time reduction. In particular, in some flash memories, the column decoding is structured hierarchically. In such memories, the memory matrix is organized in sectors (made of cell arrays) to which local decoders are coupled, whereas a set of more sectors (partition) is associated with the same global decoder. The partition is the group of sectors which share the same bank of sense amplifiers.

In such memories, a global address generator drives the global address bus, which reaches the plurality of local decoders. Such an address bus may be schematized as an RC net, and it may also be millimeters in size, representing one of the causes of the increasing access time.

According to the prior art, attempts have been made to reduce the time to access the sector forming the memory matrix, properly size the bus (width of the single wire and relative spacing between a wire and those adjacent), and act upon the dimensions of the address generator which drives the bus.

SUMMARY OF THE INVENTION

An increasingly larger reduction of non-volatile memory access time may be desired. An embodiment relates to an address decoding device. The address decoding device may include a supply terminal for a supply voltage, a conductive path configured to provide an electric signal associated with an address of at least one memory cell, and an address terminal connected to the conductive path and structured to receive the electric signal.

An address decoder may be connected to the address terminal to receive the electric signal, the decoder having associated therewith a decoding operative voltage. A switch circuit may be structured to electrically connect the address terminal to the supply terminal when the address terminal takes a threshold voltage imposed by the electric signal and to bring the address terminal to the decoding operative voltage.

The switch circuit may include a switch interposed between the address terminal and the supply terminal structured to switch between an opening configuration and a closing configuration. A driving circuit of the switch may be connected to the address terminal and configured to provide a driving signal able to control the switching from the first to the second configuration and vice versa, starting from the electric signal.

The switch may include a MOSFET transistor and the driving circuit may include at least one logic gate in CMOS technology. The switch may include a P channel MOSFET transistor having a control terminal connected to an output of the driving circuit.

The driving circuit may include a first input and a second input connected with the address terminal. A delay device may be connected to the first input and structured to provide a delayed output signal with respect to the input signal.

A driving logic gate of the switch may have a first input terminal to receive the delayed output signal, and a second input terminal connected to the second input and to an output terminal, to provide the driving signal. The delay device may include an inverting logic gate structured to return the output signal, delayed and inverted with respect to the input signal. The logic driving gate may be a NAND type. The conductive path may be an address bus for the at least one memory cell.

Another embodiment is directed to a memory system. The memory system may include a memory matrix including a plurality of memory cells, and a supply terminal for a supply voltage. The memory system may also include a conductive path configured to provide an electric signal, associated with an address of at least one memory cell and an address terminal connected to the conductive path and structured to receive the electric signal. At least one address decoder may be connected to the address terminal to receive the electric signal. The decoder may have associated therewith a decoding operative voltage. A switch circuit may be structured to electrically connect the address terminal to the supply terminal when the address terminal takes a threshold voltage, imposed by the electric signal, and to bring the address terminal to the decoding operative voltage.

The memory matrix may include a plurality of sectors. Each sector may include an array of memory cells. The sectors may be organized in rows and columns.

The memory system may be structured to implement a column decoding of the hierarchical type. The memory system may also include a row addresses decoder of the memory matrix. A global column decoder may be configured to select columns of sectors of the matrix. The at least one address decoder may include a plurality of decoders for local columns, each of them operatively associated with a respective sector.

The memory system may also include at least one generator of global addresses having an output connected to the conductive path. The conductive path may be an address bus extending from the generator of global addresses up to each address decoder of local column.

The memory matrix may be a non-volatile memory, and in particular, may include EPROM, E2PROM, and flash memory.

DETAILED DESCRIPTION OF THE PREFERRED EMBODIMENTS

Figure 1:
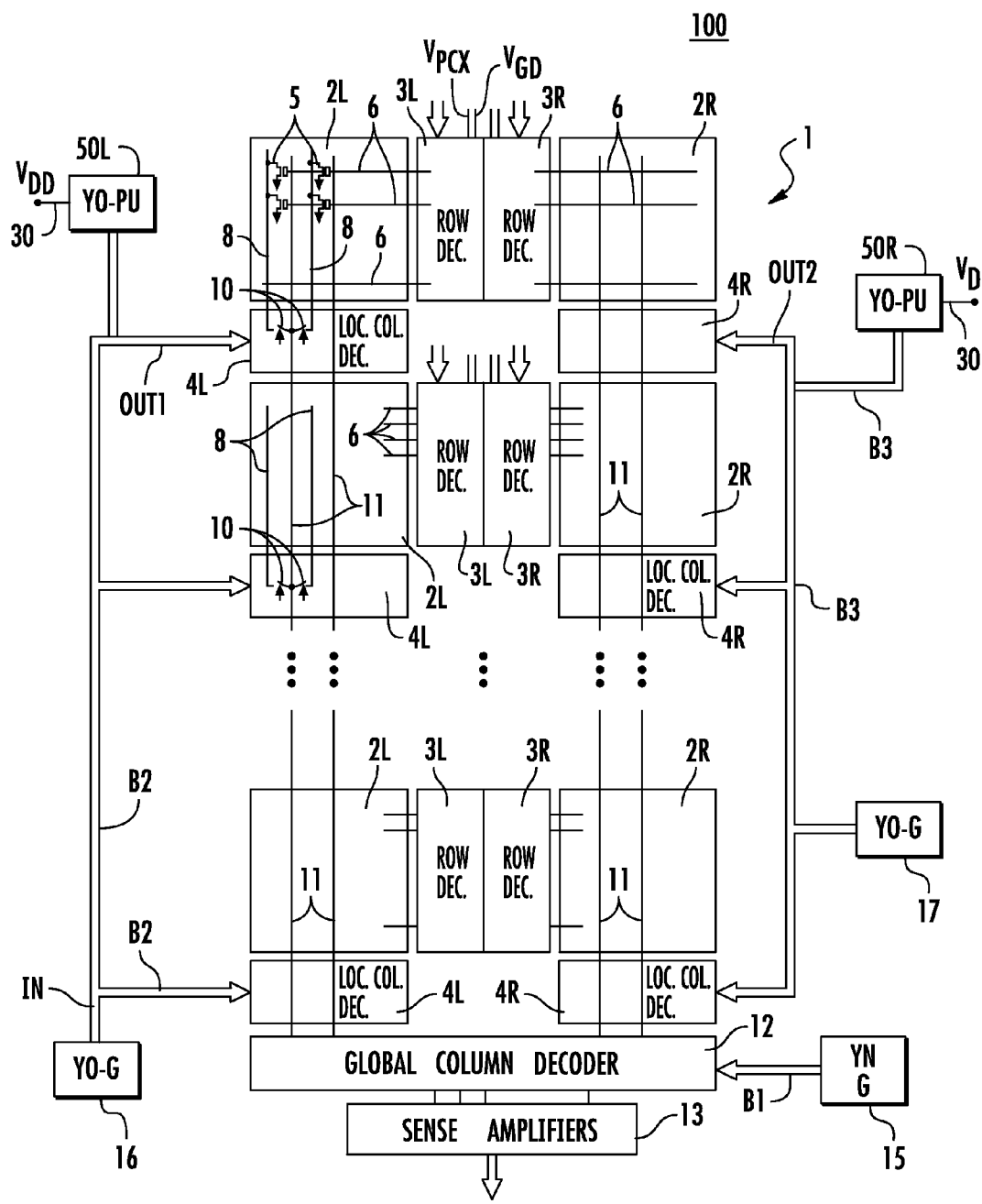
FIG. 1 is a schematic diagram of an exemplary memory system comprising row and column decoders and a driving switch circuit according to the present invention.

FIG. 1 illustrates a memory system 100 using a hierarchically type address decoding. In particular, the memory system 100 illustrated in FIG. 1 employs a hierarchical column decoding and a standard row decoding.

In further detail, the memory system 100 comprises a memory matrix 1 having a plurality of left sectors 2L and a plurality of right sectors 2R, organized on two respective columns spaced by pairs of row decoders. Each pair of row decoders comprises a right row decoder 3R, dedicated to the right side of matrix 1, and a left row decoder 3L, dedicated to the left side of matrix 1. It is to be noted that the particular architecture disclosed and illustrated is only exemplary since also other types of sector arrangements are possible.

The memory system 100 shown in FIG. 1 further comprises a global column address generator 15 (YN-G), a first global column address generator 16 (YO-G), and a second global column address generator (YO-G) 17. With respect to the column decoding, the matrix 1 is provided with a global column decoder 12 and a plurality of left column decoders 4L and a plurality of right column decoders 4R.

The global column decoder 12 is such to receive from the global column address generator 15, by a first bus B1, the addresses identifying one or more sectors 2. The global column decoder 12 has its own outputs connected to a sense amplifier apparatus 13, comprising a plurality of sense amplifiers (not shown) adapted to read the matrix cells 1.

The plurality of left column decoders 4L is adapted to receive, by a second bus B2, the cell addresses of each left sector 2L generated by the first global column address generator 16. The plurality of right column decoders 4R are adapted to receive, by a third bus B3, the addresses of the cells of each right sector 2R generated by the second global column address generator 17. Each sector 2L and 2R of the memory matrix 1 includes a non-volatile memory cell array comprising a plurality of memory cells 5 (in FIG. 1 for sake of simplicity, only a few cells are shown) organized in rows and columns.

According to the example, the memory cells 5 are of the floating gate MOSFET-type (metal oxide semiconductor field effect transistor) for which a cell in a non-programmed condition has a low threshold voltage (for example, coupled to the logic value 1). The cell programming takes place by injecting electric charges in the floating gate and thereby causing a high threshold voltage (coupled, for example, to a logic value 0).

The memory system 100 is, for example, an EPROM (electrically programmable read only memory) and, in particular, it is a flash memory, such as, an EPROM (electrically erasable PROM) memory and it may have a NAND structure or, preferably, a NOR structure.

In particular, the memory cells 5 arranged on the same row and belonging to the same right 2R or left 2L sector, are connected to the same word-line 6, which extends along the entire length of each sector, from the respective row decoder 3L or 3L. Furthermore, the memory cells 5, arranged on the same column and belonging to the same sector 2R or 2L are connected to the same local bitline 8, which extends along the entire height of each sector 2L or 2R of the respective decoder of local column 4L or 4R.

The local column decoder 4L or 4R comprises a plurality of selectors 10, such as, for example, a selection transistor (for example in CMOS technology) connected to the word-lines 6 or to the local bitlines 8 or also a global bitline 1, to allow a selection of a specific sector 2L or 2R, and the local bitline 8 as defined by the respective addresses.

For example, each left local column decoder 4L is actuated to operation, and then for selecting relative local bitlines 8, when the first address terminal OUT1 (to which the address signal provided to the second bus B2 arrives) reaches an operating voltage value adapted to switch on the selection transistors 10, besides reaching a proper electric voltage on the relative global bitline 11.

As to the second bus B2 and the third bus B3, it is to be observed that these are realized in conductive paths (which can be made by integration techniques on semiconductor chips) for electric signals which in some embodiments may have a length of some mm.

The memory system 100 further comprises at least a driving switch circuit 50L, and, according to the example, also a further driving switch circuit 50R, which allows acceleration of the selection of local bit lines 8. In particular, the driving switch circuit 50L is connected to a supply terminal 30 for a supply voltage $V_{DD}$ and the first address terminal OUT1. The first address terminal OUT1 is part of the first bus B1.

In particular, the first address terminal OUT1 itself is next to the input for the address signal of the local left column decoder 4L which is farther, in respect to the other local column decoders, from the first global column address generator 16. Likewise, the further driving switch circuit 50R is connected between the supply terminal 30 and a second address terminal OUT2 of the second bus B2.

Below, only as a way of example, reference will be made only to the driving switch circuit 50L although the same considerations apply to the further driving switch circuit 50R. It is to be observed that, due to the length of the conductive path corresponding to the second bus B2, the same bus, illustrated as an RC net, introduces a delay in the transmission of the address signal from the output terminal IN of the first global column address generator 16 to the first address terminal OUT1 entering the local column decoder 4L.

The driving switch circuit 50L intervenes in the actuation step of the local column decoders 4L. In particular, the switch circuit 50L is structured for electrically connecting the first address terminal OUT1 to the supply terminal 30 when the first address terminal OUT1 reaches a threshold voltage (lower than the operating voltage) imposed by the electric signal present on the second bus B2. This way, the driving switch circuit 50L allows the first address terminal OUT1 to be brought to the desired operating voltage adapted to actuate the local column decoder 4L, in a short time in respect to that which would be obtained without using the same switch circuit 50L.

The switch circuit 50L enables acceleration of the actuation not only of the left local column decoder 4L closest to the first address terminal OUT1, but also of the other left address local decoder 4L.

Figure 2:
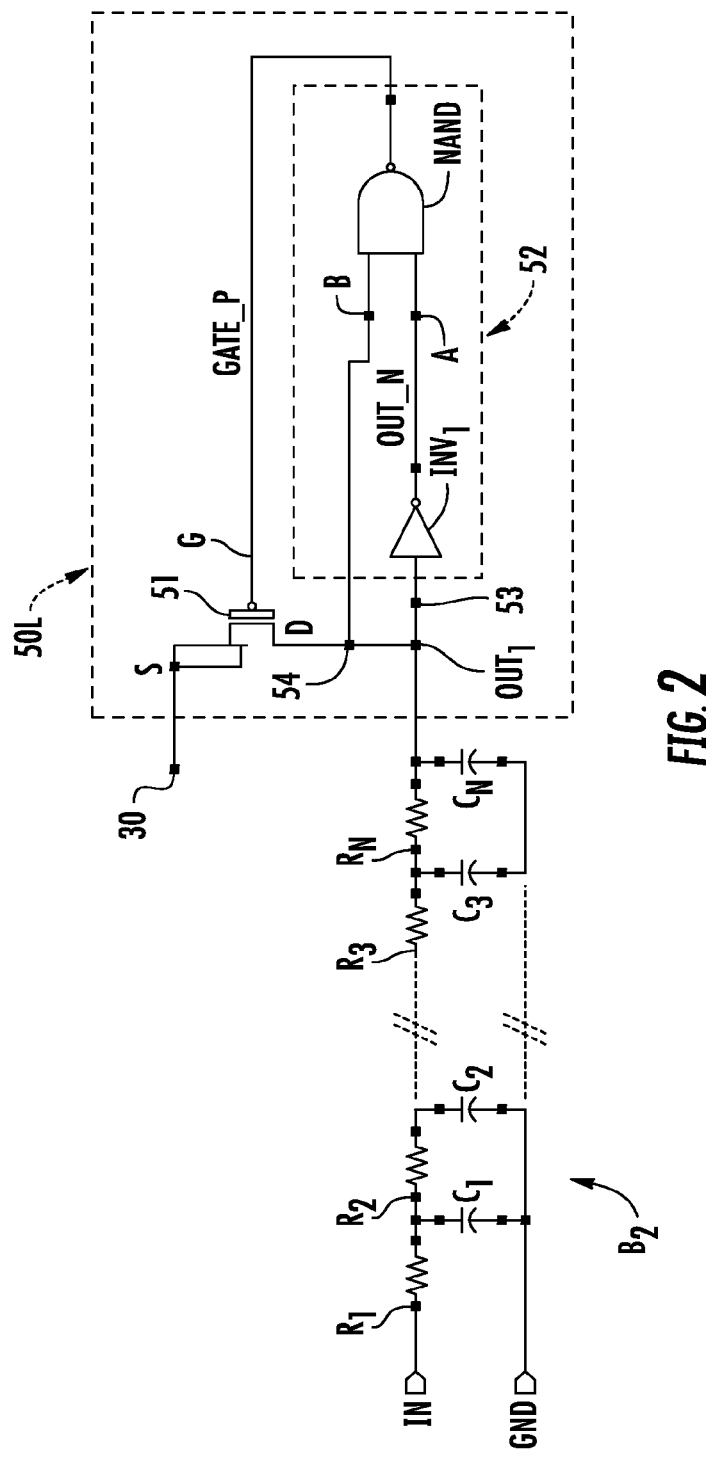
FIG. 2 is a schematic diagram of an embodiment of the driving switch circuit in accordance with the present invention.

FIG. 2 refers to a particular embodiment of the switch circuit 50L and also shows the equivalent electric scheme of the second bus B2. According to such an equivalent scheme, the second bus B2 is connected to the input terminal IN, and to a ground terminal GND, and it comprises a series of RC circuits having a respective spurious resistor $R_1$-$R_N$ and a respective spurious capacitor $C_1$-$C_N$.

The driving switch circuit 50L of FIG. 2 comprises a switch 51 and a driving circuit 52. The switch 51 is interposed between the address terminal OUT1 and the supply terminal 30 structured to switch between an opening configuration and a closing configuration. The driving circuit 52 is connected to the first address terminal OUT1 and it is configured to drive the switching from the first to the second configurations and vice-versa of the switch 51 starting from the address electric signal supplied by the second bus B2. In particular, the switch 51 includes a transistor having a control terminal G connected to an output GATE_P of the driving circuit 52, a first terminal S connected to the supply terminal 30, and a second terminal D connected to the address terminal OUT1.

According to a particular embodiment, the switch 51 is a MOSFET (metal oxide semiconductor field effect transistor). More particularly, it is of the P-channel type, wherein the control terminal G is the gate terminal, and the first terminal S is the source terminal and the second terminal D is the drain terminal.

The driving circuit 52 includes at least a logic gate, for example, made in the CMOS technology. According to the particular embodiment shown in FIG. 2, the driving circuit 52 comprises a first input 53 and a second input 54 connected to the first address terminal OUT1. The first input 53 is connected to an input terminal of the inverting logic gate INV1 configured to return an inverted signal at the output OUT_N and having an output connected to a first input A of a logic gate NAND. A second input B of the first logic gate NAND is connected to the second input 54 and therefore to the first address terminal OUT1. To the end of the operation of the driving switch circuit 50L, the inverting logic gate INV1 and the logic gate NAND are dimensioned such to provide a transient behavior, which enables the switching from the opened configuration to the closed configuration of the MOSFET switch 51 to be accelerated.

Figure 3:
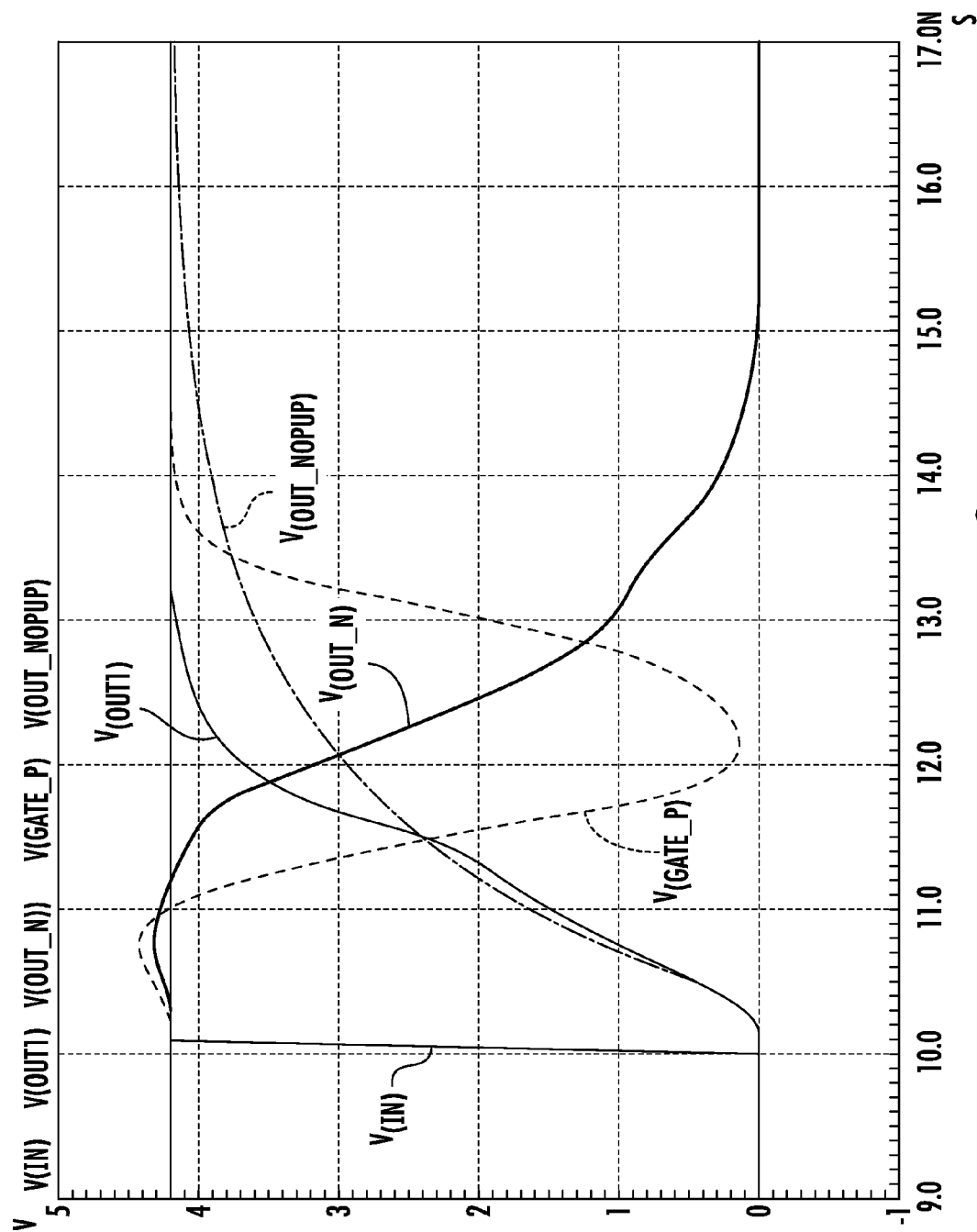
FIG. 3 is a graph of a time trend of electric signals of the driving switch circuit obtained as a result of computer simulations in accordance with the present invention.

Referring to the operation of the driving switch circuit 50L in FIG. 2, and also the diagram in FIG. 3 which shows an exemplary time trend of the following electric signals:
voltage V(IN): the voltage at the input terminal IN;
voltage V(OUT1): the voltage at the first address terminal OUT1;
voltage V(OUT_N): output voltage at the inverting logic gate INV1 and entering the logic gate NAND; and
voltage V(GATE_P): voltage applied to the control terminal G of the MOSFET 51.

In a starting step, the voltage V(IN) is null and therefore also the voltage V(OUT1) applied to the first address terminal OUT1 is null. Under this situation at the second input NAND, a low signal (0 V) is supplied, and at the first input B a higher signal (V(OUT_N) is supplied which is almost equal to 4V) exiting the inverting step INV1. The logic gate NAND returns a high signal V(GATE_P) which keeps the MOSFET 51, for example, P-channel, in the open configuration.

When the first global column address generator 16 provides the address electric signal, this propagates along the second bus B2 which introduces a delay in the propagation due to the spurious resistance and capacitance. The voltage V(OUT1) of the first address terminal OUT1 starts anyway to increase as a result, initially, only of the address electric signal.

When the voltage V(OUT1) reaches a threshold value (equal to about 2.5V), the voltage at the second input B of the logic gate NAND is then of a high logic value, and that present at the output of the inverting gate INV1 may be still considered of a high logic value. This way, the logic gate returns an output voltage V(GATE_P) having a sufficiently low value to cause the beginning of a closing transient (i.e. switch on) of the transistor 51.

Therefore, because of the switch 51 at the first address terminal OUT1, an electric charge also arrives provided by the supply terminal 30, raising the electric voltage value thereof.

The switch-on transient of MOSFET 51 carries on the increase of voltage V(OUT1) present at the second input terminal B, as long as the voltage of the first input terminal A remains at a relatively high value (higher than 1V). To this end, the inverting logic gate INV1 is dimensioned such to delay the voltage at its output V(OUT_N) in respect to the voltage increase V(OUT_N) at its input.

As illustrated in FIG. 3, until the voltage V(OUT1) remains lower than a value equal to about 3.9 V, the voltage V(GATE_P) applied to the control terminal G keeps on decreasing, causing the switch-on transient of transistor 51 to continue. Also when the voltage V(GATE_P) starts to rise again (i.e. when the output voltage V(OUT_N) at the logic gate drops below about 3 V, according to the example), the transistor 51 still remains in the closed condition, aiding the voltage V(OUT1) present at the first address terminal OUT1 to increase.

The voltage V(OUT1) then reaches the maximum value of about 4.2 V in a time equal to about 3 time units (3ns) while the voltage V(OUT_N) reaches the minimum value of 0 V after 5 ns. At this time, at the left local decoder 4L a voltage address signal arrives, suitable for its operation and therefore for selecting a determined local bitline 8. When the voltage V(GATE_P) rises above a preset value (for example 3.5V) the transistor 51 returns to the open switch configuration, i.e. it switches off.

FIG. 3 also shows the time trend of a signal V(OUT_NOPUP) representative of the behavior of voltage at the first address terminal OUT1 for a memory system without the driving switch circuit 50L. The voltage V(OUT_NOPUP) reaches the maximum value after about 7 ns, while voltage V(OUT1) reaches the same value after about 3 ns. This underlines how the switch circuit 50L enables acceleration of the selection of the local bitlines 8.

Figure 4:
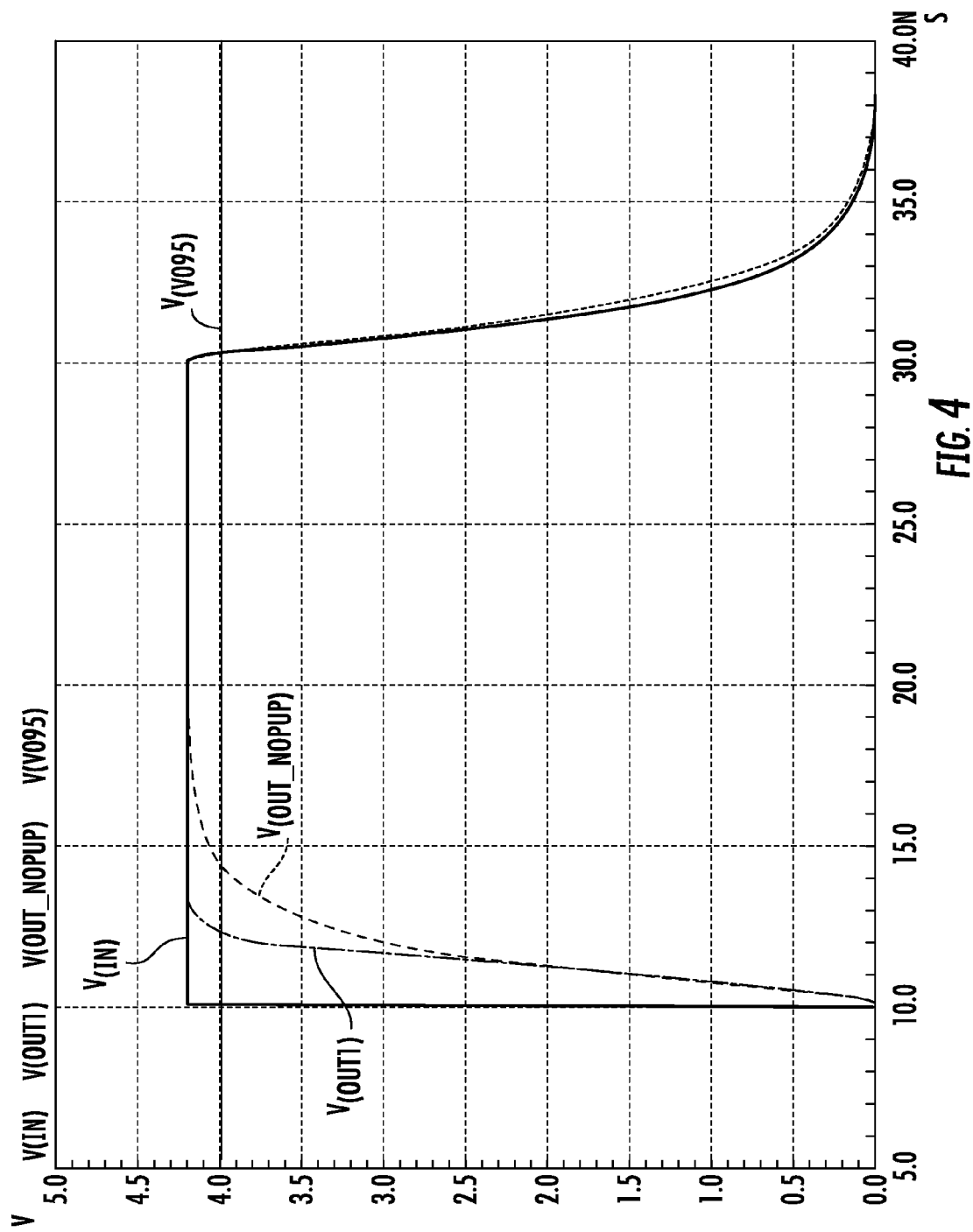
FIG. 4 is another graph of a time trend of electric signals of the driving switch circuit obtained as a result of computer simulations in accordance with the present invention.

FIG. 4 shows the time trend of the voltages V(IN), V(OUT1) and V(OUT_NOPUP) in an entire switch on and off cycle of the switch 51. The signal V(V095) represents 95% of the final value of the output voltage and it serves to establish a well-defined reference by which the signal V(V095 and the signal V(OUT_NOPUP) may be compared.

Figure 5:
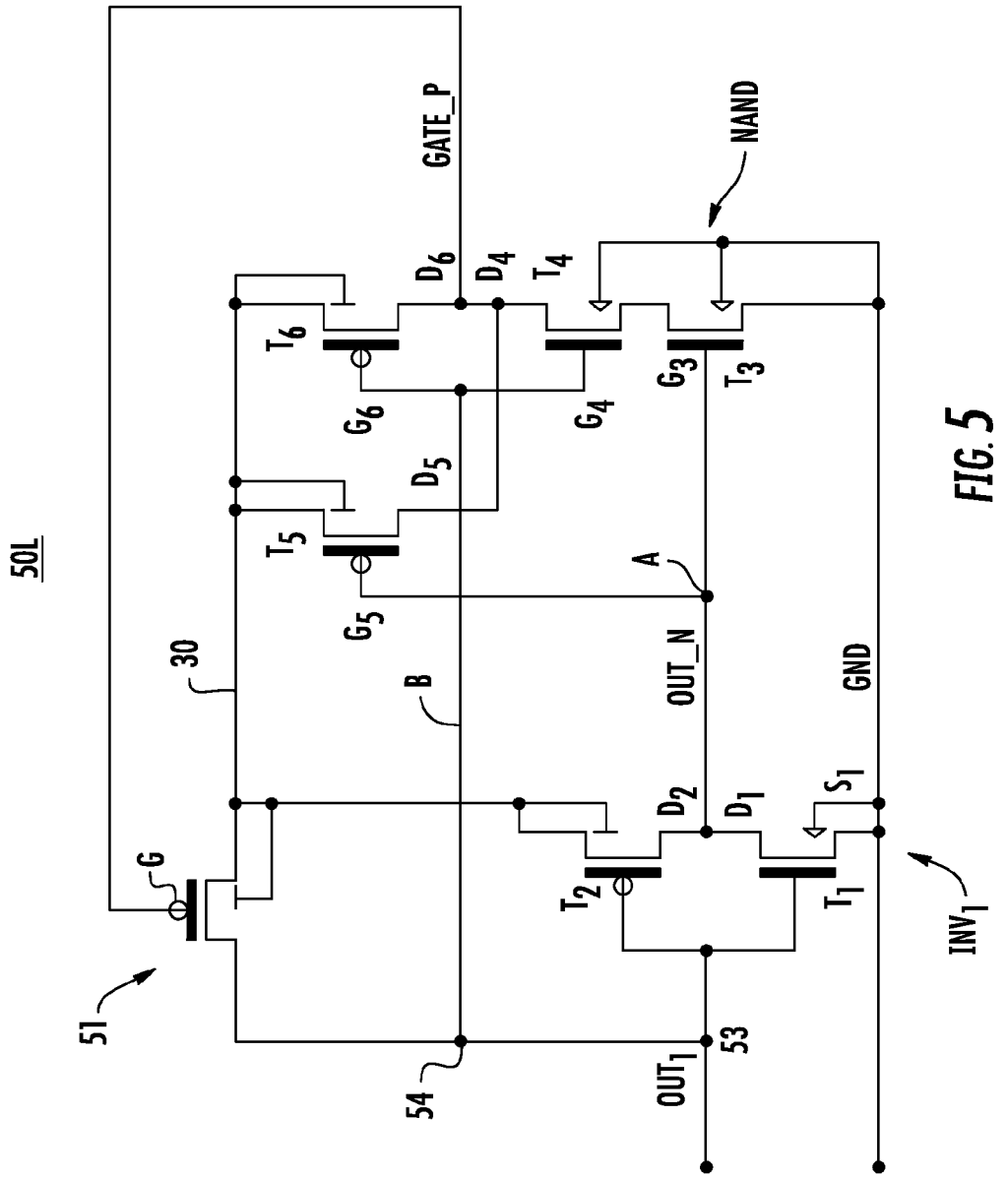
FIG. 5 is a schematic diagram of an embodiment of the driving switch circuit in accordance with the present invention.

FIG. 5 shows an exemplary embodiment of the driving circuit 52, and in particular, it illustrates an exemplary embodiment of the inverting logic gate INV1 and the logic gate NAND, according to the CMOS technology. The inverting logic gate INV1 shown in FIG. 5 comprises a first N-channel transistor T1 and a P-channel second transistor T2 connected to have the respective gate terminals connected to the first address terminal OUT1. A source terminal S1 of the first transistor T1 is connected to the ground terminal GND, whereas the drain terminal D1 of the first transistor is connected to a drain terminal D2 of the second transistor T2, which has its own source terminal connected to the supply terminal. The two drain terminals D1 and D2 are connected to the output of the inverting logic gate INV1 to supply the voltage V(OUT_N).

If the voltage at the first address terminal OUT1 is of a high logic level (or however higher than a threshold), the first transistor T1 is biased into conduction, which, then, imposes, after a transient, a low logic level. On the contrary, if the voltage at the first address terminal OUT1 is of a low logic level (or however lower than a threshold), the second transistor T2 is biased into conduction, which, then, imposes, after a transient, a high logic level.

According to an exemplary dimensioning, the aspect ratio W/L of the first transistor T1 is 1.0/3.4, whereas that of the second transistor T2 is equal to 1.0/1.0 (um). Making the length of the first transistor T1 channel suitably high, the desired delay in switching between the high logic level to the low one is achieved.

The logic gate NAND comprises an N-channel third transistor T3 and fourth transistor T4, arranged in series. Furthermore, such a logic gate NAND includes a P-channel fifth transistor T5 and sixth transistor T6. The gate terminals G3 and G5 of the third transistor T3 and the fifth transistor T5 are connected to the output OUT_N of the inverting logic gate INV1. The gate terminals G4 and G6 of the fourth transistor T4 and the sixth transistor T6 are connected to each other and to the first address terminal OUT1. The drain terminals D4, D5 and D6 of the fourth T4, fifth T5 and sixth T6 transistors are connected to the output GATE_P of the logic gate NAND, and therefore to the gate G terminal of transistor 51.

In operation, if at least one of the input voltages V(OUT1) or V(OUT_N) is at a low logic level, the corresponding N-channel transistor (i.e. the third transistor T3 and the fourth transistor T4) is forced to switch off, whereas the P-channel transistors (the fifth transistor T5 and the sixth transistor T6) are biased into conduction. The output voltage V(GATE_P) is at a high logic level.

If, contrarily, both the input voltages V(OUT1) or V(OUT_N) are at a high logic level, the corresponding P-channel transistor (the fifth transistor T5 and the sixth transistor T6) is forced to switch off, whereas the N-channel transistors (i.e. the third transistor T3 and the fourth transistor T4) are biased into conduction. The output voltage V(GATE_P) moves to a low logic level.

Below, exemplary values of the aspect ratios for the transistors related to the logic gate NAND are provided:
the third transistor T3, W/L=1.0/3.4;
the fourth transistor T3 W/L=4.0/0.72;
the fifth transistor T5 W/L=4.0/0.9; and
the sixth transistor T6 W/L=1.0/4.0.
The switch transistor 51 may have, for example, an aspect ratio of 15.0/0.72. The above exemplary numerical values form a compromise between the silicon area occupied and the desired performance.

As it emerges from the above description, the embodiment described allows the reduction of the time to access a non-volatile memory, upon reading the cells, since the time related to the column decoding operations is reduced. According to a particular exemplary embodiment, the memory system 100 may be used within microprocessors, such as those used in the automotive field and, more particularly, for managing the braking system ABS, for controlling the engine or other electronic devices on-board of a motor-vehicle.

That which is claimed:

1. An address decoding device comprising:
a supply terminal;
a conductive path configured to provide an electric signal associated with an address of at least one memory cell;
an address terminal coupled to the conductive path and configured to receive the electric signal;
an address decoder coupled to the address terminal and configured to receive the electric signal, said address decoder having a decoding operative voltage associated therewith; and
a switch circuit configured to electrically couple the address terminal to the supply terminal when the address terminal exceeds a threshold voltage related to the electric signal, and to bring the address terminal to the decoding operative voltage.

2. The address decoding device according to claim 1, wherein said switch circuit comprises:
a switch coupled between the address terminal and the supply terminal, an configured to switch between an opening configuration and a closing configuration; and
a driving circuit coupled to the address terminal and configured to provide a driving signal to control switching from the open configuration to the closed configuration and vice versa, based upon the electric signal.

3. The address decoding device according to claim 2, wherein said switch comprises a metal oxide semiconductor field effect transistor (MOSFET); and wherein said driving circuit comprises at least one complementary metal oxide semiconductor (CMOS) logic gate.

4. The address decoding device according to claim 2, wherein said switch comprises a P-channel a metal oxide semiconductor field effect transistor (MOSFET) having a control terminal coupled to an output of said driving circuit.

5. The address decoding device according to claim 2, wherein said driving circuit comprises:
a first input and a second input coupled to the address terminal;
a delay device coupled to the first input and configured to provide a delayed output signal with respect to an input signal; and
a driving logic gate having a first input terminal configured to receive the delayed output signal, and a second input terminal coupled to the second input and to an output terminal and configured to provide a driving signal.

6. The address decoding device according to claim 5, wherein said delay device comprises an inverting logic gate configured to return the delayed output signal delayed and inverted with respect to the input signal.

7. The address decoding device according to claim 5, wherein said driving logic gate comprises a NAND gate.

8. The address decoding device according to claim 1, wherein the conductive path comprises an address bus for the at least one memory cell.

9. A memory comprising:
a memory matrix comprising a plurality of memory cells;
a supply terminal;
a conductive path configured to provide an electric signal associated with an address of at least one memory cell of the plurality thereof;
an address terminal coupled to the conductive path and configured to receive the electric signal;
at least one address decoder coupled to the address terminal and configured to receive the electric signal, said at least one address decoder having a decoding operative voltage associated therewith; and
a switch circuit configured to electrically couple the address terminal to the supply terminal when said at least one address terminal exceeds a threshold voltage related to the electric signal, and to bring the address terminal to the decoding operative voltage.

10. The memory according to claim 9, wherein said memory matrix comprises a plurality of sectors each comprising an array of memory cells; said sectors being arranged in rows and columns.

11. The memory according to claim 10, further comprising:
a row addresses decoder; and
a global column decoder configured to select columns of said plurality of sectors;

said at least one address decoder comprising a plurality of address decoders for local columns, each being operatively associated with a respective sector.

12. The memory according to claim 11, further comprising at least one global address generator having an output coupled to the conductive path; the conductive path being an address bus extending from the global address generator to each address decoder of a local column.

13. The memory according to claim 9, wherein said memory matrix comprises non-volatile memory.

14. The memory according to claim 13, wherein said non-volatile memory comprises one of erasable programmable read only memory (EPROM), electrically erasable programmable read only memory (E2PROM), and flash memory.

15. A method of address decoding comprising:
providing an electric signal associated with an address of at least one memory cell to an address terminal using a conductive path;
receiving the electrical signal at an address decoder coupled to the address terminal, the address decoder having a decoding operative voltage associated therewith; and
electrically coupling the address terminal to a supply terminal using a switch circuit when the address terminal exceeds a threshold voltage imposed by the electric signal, and bringing the address terminal to the decoding operative voltage.

16. The method according to claim 15, wherein electrically coupling the address terminal to the supply terminal using the switch circuit comprises:
switching between an opening configuration and a closing configuration using a switch coupled between the address terminal and the supply terminal; and
providing a driving signal based upon the electric signal to control the switching between the open configuration to the closed configuration using a driving circuit coupled to the address terminal.

17. The method according to claim 16, wherein the switch comprises a metal oxide semiconductor field effect transistor (MOSFET); and wherein the driving circuit comprises at least one complementary metal oxide semiconductor (CMOS) logic gate.

18. The method according to claim 16, wherein the switch comprises a P-channel a metal oxide semiconductor field effect transistor (MOSFET) having a control terminal coupled to an output of the driving circuit.

19. The method according to claim 16, wherein providing the driving signal using the driving circuit comprises providing the driving signal using a driving circuit comprising a first input and a second input coupled to the address terminal, a delay device coupled to the first input and configured to provide a delayed output signal with respect to an input signal, and a driving logic gate having a first input terminal configured to receive the delayed output signal, and a second input terminal coupled to the second input and to an output terminal and configured to provide a driving signal.

* * * * *

UNITED STATES PATENT AND TRADEMARK OFFICE
CERTIFICATE OF CORRECTION

Page 1 of 1

| | |
|---|---|
| PATENT NO. | : 8,619,491 B2 |
| APPLICATION NO. | : 13/406186 |
| DATED | : December 31, 2013 |
| INVENTOR(S) | : Perroni et al. |

It is certified that error appears in the above-identified patent and that said Letters Patent is hereby corrected as shown below:

In the Claims:

|  | Delete: "an" |
|---|---|
| Column 8, Line 7 | Insert: -- and -- |

Signed and Sealed this
Sixteenth Day of September, 2014

Michelle K. Lee
*Deputy Director of the United States Patent and Trademark Office*